United States Patent
Sun et al.

(10) Patent No.: US 9,400,230 B2
(45) Date of Patent: Jul. 26, 2016

(54) DEVICE FOR TESTING LOADING PERFORMANCE OF WHEELCHAIR MOTOR

(71) Applicant: Zhejiang Linix Motor Co., Ltd., Dongyang, Zhejiang (CN)

(72) Inventors: Zhubing Sun, Zhejiang (CN); Shan Du, Zhejiang (CN)

(73) Assignee: ZHEJIANG LINIX MOTOR CO., LTD., Dongyang, Zhejiang (CN)

( * ) Notice: Subject to any disclaimer, the term of this patent is extended or adjusted under 35 U.S.C. 154(b) by 200 days.

(21) Appl. No.: 14/324,541

(22) Filed: Jul. 7, 2014

(65) Prior Publication Data

US 2015/0316443 A1     Nov. 5, 2015

(30) Foreign Application Priority Data

Apr. 30, 2014  (CN) .......................... 2014 1 0178565

(51) Int. Cl.
| | |
|---|---|
| *G01L 3/02* | (2006.01) |
| *G01M 15/02* | (2006.01) |
| *G01L 3/24* | (2006.01) |
| *F16B 1/00* | (2006.01) |
| *G01J 3/02* | (2006.01) |
| *F16B 2/02* | (2006.01) |

(52) U.S. Cl.
CPC .............. *G01M 15/02* (2013.01); *F16B 1/005* (2013.01); *F16B 2/02* (2013.01); *G01J 3/02* (2013.01); *G01L 3/242* (2013.01)

(58) Field of Classification Search
CPC ............. G01L 3/242; G01L 3/02; G01L 3/14; G01L 3/1414; G01L 3/1421; G01L 3/1428; G01L 3/1435; G01L 3/1442; G01L 3/145; G01L 3/1457; G01L 3/16; G01L 3/18; G01L 3/22; G01M 15/02; F16B 1/005; F16B 1/0057; F16B 2/02; F16B 2/18
See application file for complete search history.

(56) References Cited

U.S. PATENT DOCUMENTS

| | | | | |
|---|---|---|---|---|
| 4,062,233 A | * | 12/1977 | Bonomo | .................... G01L 3/20 73/862.11 |
| 4,195,494 A | * | 4/1980 | Kinney | ...................... G01L 3/18 464/158 |
| 7,926,336 B2 | * | 4/2011 | Vickio, Jr. | ............. G01M 15/02 73/116.02 |

* cited by examiner

*Primary Examiner* — Blake A Tankersley
(74) *Attorney, Agent, or Firm* — Global IP Services; Tainhua Gu

(57) ABSTRACT

A device for testing loading performance of a wheelchair motor, comprising a pedestal. A torque-speed transducer is fixed on the pedestal, one end being connected to a wheelchair motor to be tested while the other end thereof being connected to an adjustable magnetic powder brake. A pneumatic quick-clamping device is provided on the pedestal connected to the output shaft of the wheelchair motor to be tested, the pneumatic quick-clamping device being used for connecting and fixing the wheelchair motor to be tested, and comprising a support platform, a motor connecting plate and a plurality of cylinders. The support platform is supported and mounted above the pedestal through cylindrical bodies. The motor connecting plate is fixed with the wheelchair motor to be tested. The downward movement of the piston rods can compress the compression heads onto the motor connecting plate to compress and fix the motor connecting plate, thus to fix the wheelchair motor to be tested.

12 Claims, 2 Drawing Sheets

DEVICE FOR TESTING LOADING PERFORMANCE OF WHEELCHAIR MOTOR

CROSS REFERENCE TO RELATED PATENT APPLICATION

The present application claims the priority of Chinese patent application CN 201410178565.7 filed on Apr. 30, 2014.

TECHNICAL FIELD

The present invention relates to a device for testing loading performance of a motor, in particular to a device for testing loading performance of a wheelchair motor.

BACKGROUND OF THE INVENTION

At present, more and more wheelchair equipments are driven by wheelchair motors because the electrical energy is clean, green, environmentally friendly and pollution-free. Additional arrangement of a wheelchair motor on a wheelchair may make the wheelchair rider feel more comfortable. Torque-speed performance tests are often carried out for wheelchair motors when delivery. The wheelchair motors need to be fixed by other fixtures, because the wheelchair motors themselves have no fixture. The wheelchair motors will generate great shock during operating. Traditionally, a wheelchair motor is directly fixed on a support by screws. However, the support itself is inconveniently adjustable, failing to fit motors of different types and sizes. Moreover, such fixation manner is very tedious and both time and labor consuming, resulting in some troubles for workers when carrying out torque-speed performance tests for large-batch wheelchair motors.

SUMMARY OF THE INVENTION

In order to overcome the deficiency in the prior art that it is inconvenient to fix a wheelchair motor to be tested during a loading performance test for motors, the present invention provides a device for testing loading performance of a wheelchair motor. With the advantages of simple structure, easy operation and improved detection efficiency, this device is suitable for carrying out torque-speed performance tests for large-batch wheelchair motors, and well solves the problem that it is inconvenient to fix a wheelchair motor during the detection.

In order to achieve the object mentioned above, the present invention employs the following technical solution.

The present invention provides a device for testing loading performance of a wheelchair motor, comprising a pedestal. A torque-speed transducer is fixed on the pedestal, one end of the torque-speed transducer being connected to the output shaft of a wheelchair motor to be tested while the other end thereof being connected to an adjustable magnetic powder brake. A pneumatic quick-clamping device is provided on the pedestal at a position corresponding to the end of the torque-speed transducer connected to the output shaft of the wheelchair motor to be tested, the pneumatic quick-clamping device being used for connecting and fixing the wheelchair motor to be tested, and comprising a support platform, a motor connecting plate and a plurality of cylinders. The support platform is supported and mounted above the pedestal through cylindrical bodies. The plurality of cylinders are mounted and fixed below the pedestal, the piston rods of the cylinders being penetrated upward through both the pedestal and the support platform, a compression head being provided at the upper end of each of the piston rods. The motor connecting plate is provided with a through hole configured to fix with the wheelchair motor to be tested, and two spaced-apart open pores configured to fit the compression heads at the upper ends of the piston rods, openings from which the piston rods can enter being provided on the side walls of the open pores. The downward movement of the piston rods can compress the compression heads onto the motor connecting plate to compress and fix the motor connecting plate, thus to fix the wheelchair motor to be tested. The wheelchair motor to be tested may be fixed quickly and reliably by the arrangement of the pneumatic quick-clamping device, thus improving both the working efficiency of test operations and the accuracy of test results. The lower end face of the wheelchair motor to be tested is fixed with the motor connecting plate by fasteners such as screws; the openings on the side walls of the open pores of motor connecting plate are aligned to the side faces of the piston rods; the motor connecting plate is pushed to make the compression heads at the ends of the piston rods locate above the open pores; and finally the cylinders are started to drive the piston rods to move downward to further compress the compression heads onto the upper surfaces around the open pores. So far, the wheelchair motor to be tested is fixed reliably and quickly. As the wheelchair motor to be tested is clamped by the pneumatic quick-clamping device via the motor connecting plate, in the case that the device for testing loading performance of a wheelchair motor to be tested is debugged, by selecting different connecting plates to fit wheelchair motors of different specifications to be tested, the device is allowed to be universal; meanwhile, the detection efficiency may be improved, the working hours of workers are reduced, and the cost is saved. The torque-speed transducer may display the detection data intuitively, so that the operational ease is improved. The adjustable magnetic powder brake is used for offsetting the output torque of the wheelchair motor to be tested. The open pores are connecting holes provided at the front and back of the motor connecting plate for fixing the motor. Openings, from which the piston rods may enter, are provided on the side walls of the open pores. The motor is fixed by the coordination of the compression heads and the motor connecting plate, preventing the motor from generating severe shock during testing. During mounting and fixing, the motor is fixed on the motor connecting plate, and the position of the motor connecting plate is adjusted; the cylinders drive the piston rods to penetrate upward through both the pedestal and the support platform, and the piston rods are fitted with the open pores; and the downward movement of the piston rods driven by the cylinders can compress the compression heads onto the motor connecting plate to compress and fix the motor connecting plate, thus to fix the wheelchair motor to be tested.

Preferably, first conical surfaces are formed on the lower end faces of the compression heads, and second conical surfaces that may be fitted with the first conical surfaces are formed on the upper end faces of the open pores. The first conical surfaces and the second conical surfaces are in compression fit, to fix the compression heads and the motor connecting plate in both the horizontal direction and the vertical direction, thereby fixing the motor better.

Preferably, a lateral bulge is formed on the motor connecting plate at a position between the two open pores, the lateral bulge having a narrow top portion and a wide bottom portion, the bottom portion of the lateral bulge being connected to walls of the open pores, two side walls of the lateral bulge forming guide slopes. After the wheelchair motor to be tested is fixed on the motor connecting plate, just by extending the ends of the lateral bulge of the motor connecting plate into a space between the two piston rods and continuing pushing the motor connecting plate, in the aid of the coordination of the guide slopes on the two sides of the lateral bulge and the piston rods, the two piston rods may enter the two open pores quickly. The speed for fixing the wheelchair motor to be tested on the device provided by the present invention is greatly increased, so that the testing efficiency is improved.

Preferably, a spring coupling, configured to connect the output shaft of the wheelchair motor to be tested, is provided at one end of the torque-speed transducer. The arrangement of the spring coupling makes the structure simple and the mounting and dismounting convenient, and has large bearing range of fluctuating loads, reduced noise and good vibration damping performance.

Preferably, the spring coupling is provided with a flange plate configured to connect the output shaft of the wheelchair motor to be tested. The arrangement of the flange plate is to guarantee the fastness between the wheelchair motor to be tested and the spring coupling, to make the device connection more reliable.

Preferably, positive/negative switching joints are provided at connection ends of the torque-speed transducer and the adjustable magnetic powder brake. The arrangement of the positive/negative switching joints enables the adjustable magnetic powder brake to adapt to the wheelchair motors of different rotation directions to be tested.

Preferably, pneumatic throttles are provided on the cylinders. The pneumatic throttles may be used for adjusting the air pressure in the cylinders.

Therefore, the present invention has the following beneficial effects that the device is suitable for testing torque-speed performance of large-batch wheelchair motors due to simple structure, easy operation and improved detection efficiency, and may well solve the problem that it is inconvenient to fix a wheelchair motor during the detection; meanwhile, the device is allowed to be universal so that it adapts to the wheelchair motors of different specifications.

Figure 1:
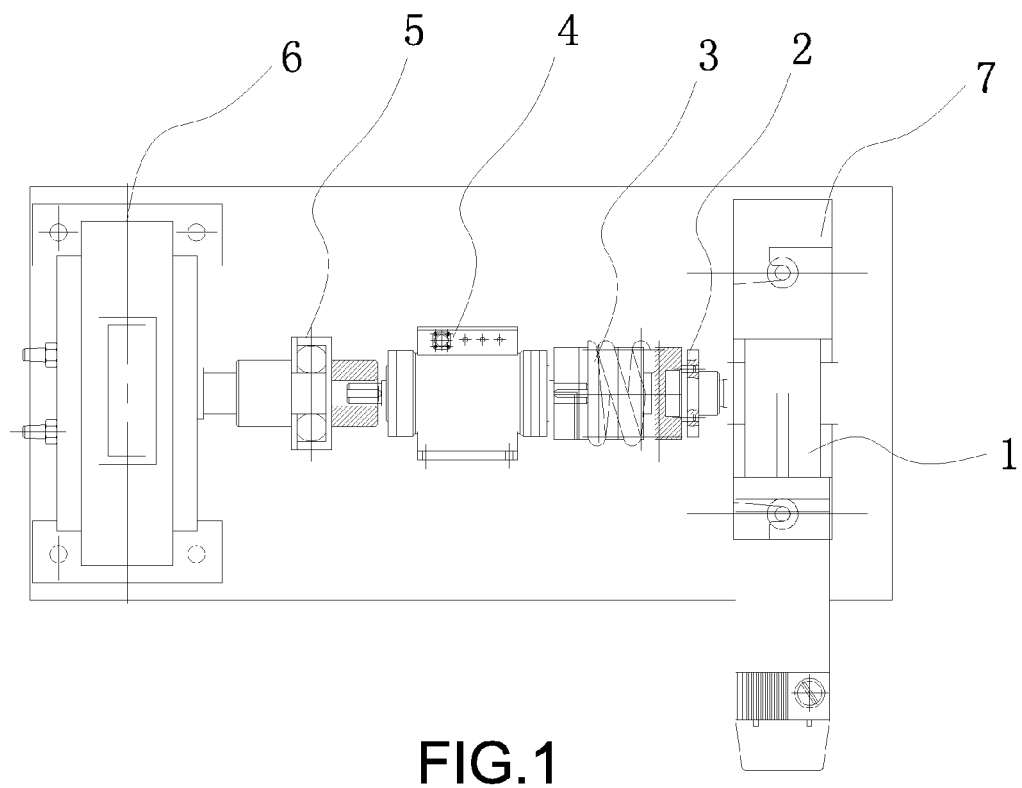
FIG. 1 is a structure diagram according to the present invention.

in the drawings: 1—Wheelchair motor; 2—Flange plate; 3—Spring coupling; 4—Torque—speed transducer; 5—Positive/negative switching joints; 6—Adjustable magnetic powder brake; 7—Pneumatic quick—clamping device; 71—Pedestal; 721—Piston rod; 722—Compression head; 73—Cylinder; 731—Pneumatic throttle; 74—Support platform; 75—First conical surface; 8—Motor connecting plate; 81—Open pore; 82—Guide slope; 83—Second conical surface.

DETAILED DESCRIPTION OF THE INVENTION

The present invention will be further described in details as below with reference to the drawings by specific embodiments.

Embodiment

Figure 2:
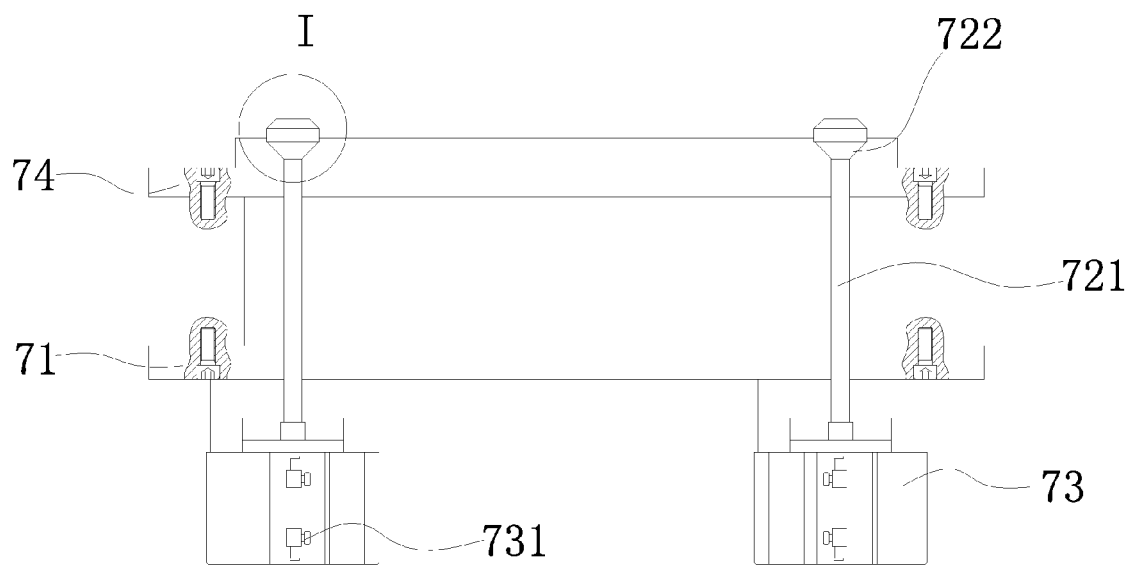
FIG. 2 is a structure diagram of a pneumatic quick-clamping device according to the present invention.

As shown in FIGS. 1-2, a device for testing loading performance of a wheelchair motor is provided, comprising a pedestal 71. A torque-speed transducer 4 is fixed on the pedestal 71, one end of the torque-speed transducer 4 being connected to the output shaft of a wheelchair motor 1 to be tested while the other end thereof being connected to an adjustable magnetic powder brake 6. A pneumatic quick-clamping device 7 is provided on the pedestal 71 at a position corresponding to the end of the torque-speed transducer 4 connected to the output shaft of the wheelchair motor 1 to be tested, the pneumatic quick-clamping device 7 being used for connecting and fixing the wheelchair motor 1 to be tested, and comprising a support platform 74, a motor connecting plate 8 and a plurality of cylinders 73. The support platform 74 is supported and mounted above the pedestal 71 through cylindrical bodies. The plurality of cylinders 73 are mounted and fixed below the pedestal 71, the piston rods 721 of the cylinders 73 being penetrated upward through both the pedestal 71 and the support platform 74, and a compression head 722 being provided at the upper end of each of the piston rods 721. The motor connecting plate 8 is provided with a through hole configured to fix with the wheelchair motor 1 to be tested, and two spaced-apart open pores 81 configured to fit the compression heads 722 at the upper ends of the piston rods 721. Openings, from which the piston rods 721 may enter, are provided on the side walls of the open pores 81. The downward movement of the piston rods 721 can compress the compression heads 722 onto the motor connecting plate 8 to compress and fix the motor connecting plate 8, thus to fix the wheelchair motor 1 to be tested. The wheelchair motor 1 to be tested may be fixed quickly and reliably by the arrangement of the pneumatic quick-clamping device 7, thus improving both the working efficiency of test operations and the accuracy of test results. The lower end face of the wheelchair motor 1 to be tested is fixed with the motor connecting plate 8 by fasteners such as screws; then the openings on the side walls of the open pores 81 of the motor connecting plate 8 are aligned to the side faces of the piston rods 721; the motor connecting plate 8 is pushed to make the compression heads 722 at the ends of the piston rods 721 locate above the open pores; and finally the cylinders 73 are started to drive the piston rods 721 to move downward to further compress the compression heads 722 onto the upper surfaces around the open pores 81. So far, the wheelchair motor to be tested is fixed reliably and quickly. As the wheelchair motor 1 to be tested is clamped by the pneumatic quick-clamping device 7 via the motor connecting plate 8, in the case that the device for testing loading performance of a wheelchair motor 1 to be tested is debugged, by selecting different connecting plates to fit wheelchair motors 1 of different specifications to be tested, the device is allowed to be universal; meanwhile, the detection efficiency may be improved, the working hours of workers are reduced, and the cost is saved. The torque-speed transducer may display the detection data intuitively, so that the operational ease is improved. The adjustable magnetic powder brake 6 is used for offsetting the output torque of the wheelchair motor 1 to be tested. The open pores 81 are connecting holes provided at the front and back of the motor connecting plate 8 for fixing the motor. Openings, from which the piston rods 721 may enter, are provided on the side walls of the open pores 81. The motor is fixed by the coordination of the compression heads 722 and the motor connecting plate 8, preventing the motor from generating severe shock during testing. During mounting and fixing, the motor is fixed on the motor connecting plate 8, and the position of the motor connecting plate 8 is adjusted; the cylinders 73 drive the piston rods 721 to penetrate upward through both the pedestal 71 and the support platform 74, and the piston rods 721 are fitted with the open pores 81; and the downward movement of the piston rods 721 driven by the cylinders 73 can compress the compression heads 722 onto the motor connecting plate 8 to compress and fix the motor connecting plate 8, thus to fix the wheelchair motor 1 to be tested.

Figure 3:
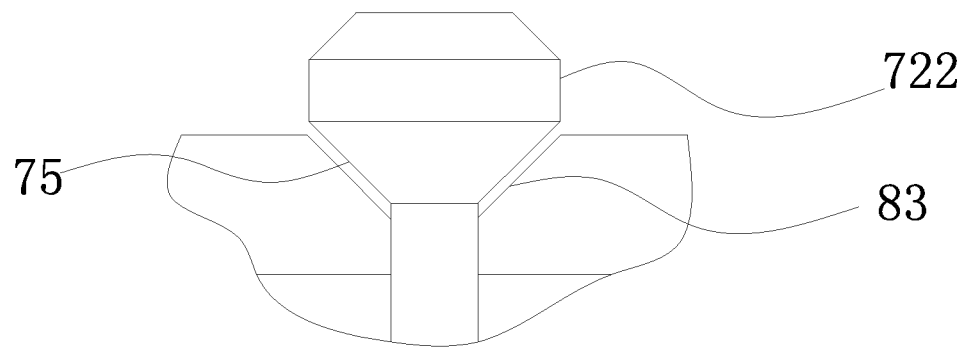
FIG. 3 is a partially enlarged view of part I of FIG. 2 according to the present invention.
Figure 4:
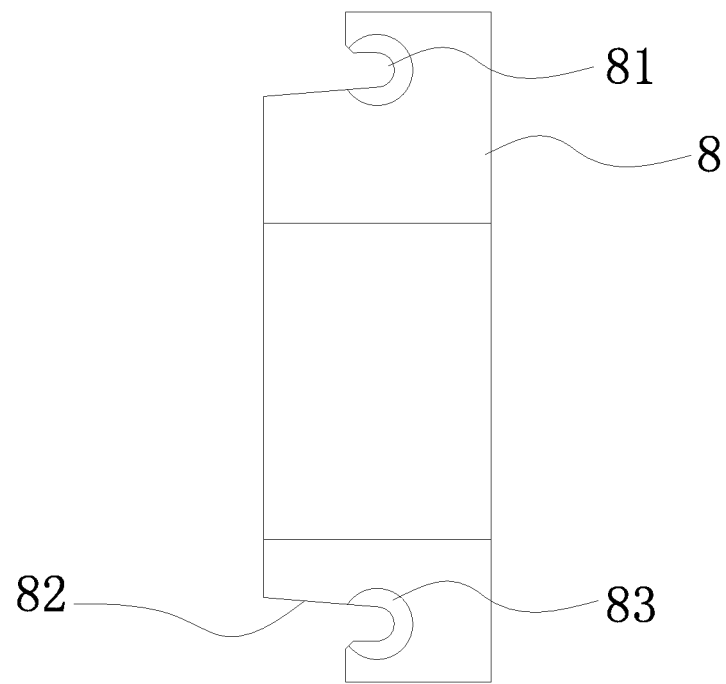
FIG. 4 is a connection structure diagram of a motor connecting plate according to the present invention.

As shown in FIG. 3 and FIG. 4, first conical surfaces 75 are formed on the lower end faces of the compression heads 722, and second conical surfaces 83 that may be fitted with the first conical surfaces 75 are formed on the upper end faces of the open pores 81. The first conical surfaces 75 and the second conical surfaces 83 are in compression fit, to fix the compression heads 722 and the motor connecting plate 8 in both the horizontal direction and the vertical direction, thereby fixing the motor better.

As shown in FIG. 2 and FIG. 4, a lateral bulge is formed on the motor connecting plate 8 at a position between the two open pores 81; the lateral bulge has a narrow top portion and a wide bottom portion, the bottom portion of the lateral bulge being connected to walls of the open pores 81, two side walls of the lateral bulge forming guide slopes 82. After the wheelchair motor 1 to be tested is fixed on the motor connecting plate 8, just by extending the ends of the lateral bulge of the motor connecting plate 8 into a space between the two piston rods 721 and continuing pushing the motor connecting plate, in the aid of the coordination of the guide slopes 82 on the two sides of the lateral bulge and the piston rods 721, the two piston rods 721 may enter the two open pores 81 quickly. The speed for fixing the wheelchair motor 1 to be tested on the device provided by the present invention is greatly increased, so that the testing efficiency is improved.

As shown in FIG. 1, a spring coupling 3, configured to connect the output shaft of the wheelchair motor 1 to be tested, is provided at one end of the torque-speed transducer 4. The arrangement of the spring coupling 3 makes the structure simple and the mounting and dismounting convenient, and has large bearing range of fluctuating loads, reduced noise and good vibration damping performance. The spring coupling 3 is provided with a flange plate 2 configured to connect the output shaft of the wheelchair motor 1 to be tested. The arrangement of the flange plate 2 is to guarantee the fastness between the wheelchair motor 1 to be tested and the spring coupling 3, to make the device connection more reliable.

As shown in FIGS. 1 and FIG. 2, positive/negative switching joints 5 are provided at connection ends of the torque-speed transducer 4 and the adjustable magnetic powder brake 6. The arrangement of the positive/negative switching joints 5 enables the adjustable magnetic powder brake 6 to adapt to the wheelchair motors 1 of different rotation directions to be tested. Pneumatic throttles 731 are provided on the cylinders 73. The pneumatic throttles 731 may be used for adjusting the air pressure in the cylinders 73.

During fixing, a suitable motor connecting plate 8 is firstly selected and the wheelchair motor 1 to be tested is fixed on the suitable motor connecting plate 8 by screws; the position of the motor connecting plate 8 is adjusted; the cylinders 73 drive the piston rods 721 to penetrate upward through both the pedestal 71 and the support platform 74, and the piston rods 721 are fitted with the open pores 81; and the downward movement of the piston rods 721 driven by the cylinders 73 can compress the compression heads 722 onto the motor connecting plate 8 to compress and fix the motor connecting plate 8, thus to fix the wheelchair motor 1 to be tested.

During testing, one end of the torque-speed transducer 4 is connected to the output shaft of the wheelchair motor 1 to be tested through the spring coupling 3; the flange plates 2 are provided at connection ends of the spring coupling 3 and the output shaft of the wheelchair motor 1 to be tested; the other end of the torque-speed transducer 4 is connected to the adjustable magnetic powder brake 6; and the positive/negative switching joints 5 are provided at connection ends of the torque-speed transducer 4 and the adjustable magnetic powder brake 6. Once the wheelchair motor 1 to be tested is started, the torque-speed transducer 4 displays the test data.

What is claimed is:

1. A device for testing loading performance of a wheelchair motor, comprising a pedestal, characterized in that a torque-speed transducer is fixed on the pedestal, one end of the torque-speed transducer being connected to an output shaft of a wheelchair motor to be tested while the other end thereof being connected to an adjustable magnetic powder brake; a pneumatic quick-clamping device is provided on the pedestal at a position corresponding to the end of the torque-speed transducer connected to the output shaft of the wheelchair motor to be tested, the pneumatic quick-clamping device being used for connecting and fixing the wheelchair motor to be tested, and comprising a support platform, a motor connecting plate and a plurality of cylinders; the support platform is supported and mounted above the pedestal through cylindrical bodies; the plurality of cylinders are mounted and fixed below the pedestal, the piston rods of the cylinders being penetrated upward through both the pedestal and the support platform, and a compression head being provided at the upper end of each of the piston rods; the motor connecting plate is provided with a through hole configured to fix with the wheelchair motor to be tested, and two spaced-apart open pores configured to fit the compression heads at the upper ends of the piston rods, openings from which the piston rods can enter being provided on the side walls of the open pores; and the downward movement of the piston rods can compress the compression heads onto the motor connecting plate to compress and fix the motor connecting plate, thus to fix the wheelchair motor to be tested.

2. The device for testing loading performance of a wheelchair motor according to claim 1, wherein first conical surfaces are formed on the lower end faces of the compression heads, and second conical surfaces that can be fitted with the first conical surfaces are formed on the upper end faces of the open pores.

3. The device for testing loading performance of a wheelchair motor according to claim 2, wherein a lateral bulge is formed on the motor connecting plate at a position between the two open pores, the lateral bulge having a narrow top portion and a wide bottom portion, the bottom portion of the lateral bulge being connected to walls of the open pores, two side walls of the lateral bulge forming guide slopes.

4. The device for testing loading performance of a wheelchair motor according to claim 2, wherein a spring coupling, configured to connect the output shaft of the wheelchair motor to be tested, is provided at one end of the torque-speed transducer.

5. The device for testing loading performance of a wheelchair motor according to claim 4, wherein the spring coupling is provided with a flange plate configured to connect the output shaft of the wheelchair motor to be tested.

6. The device for testing loading performance of a wheelchair motor according to claim 2, wherein positive/negative switching joints are provided on connection ends of the torque-speed transducer and the adjustable magnetic powder brake.

7. The device for testing loading performance of a wheelchair motor according to claim 2, wherein pneumatic throttles are provided on the cylinders.

8. The device for testing loading performance of a wheelchair motor according to claim 1, wherein a lateral bulge is formed on the motor connecting plate at a position between the two open pores, the lateral bulge having a narrow top portion and a wide bottom portion, the bottom portion of the lateral bulge being connected to walls of the open pores, two side walls of the lateral bulge forming guide slopes.

9. The device for testing loading performance of a wheelchair motor according to claim 1, wherein a spring coupling, configured to connect the output shaft of the wheelchair motor to be tested, is provided at one end of the torque-speed transducer.

10. The device for testing loading performance of a wheelchair motor according to claim 9, wherein the spring coupling is provided with a flange plate configured to connect the output shaft of the wheelchair motor to be tested.

11. The device for testing loading performance of a wheelchair motor according to claim 1, wherein positive/negative switching joints are provided on connection ends of the torque-speed transducer and the adjustable magnetic powder brake.

12. The device for testing loading performance of a wheelchair motor according to claim 1, wherein pneumatic throttles are provided on the cylinders.

\* \* \* \* \*